United States Patent
Dalton

(10) Patent No.: US 7,065,734 B2
(45) Date of Patent: Jun. 20, 2006

(54) METHOD OF GENERATING MULTIPLE HARDWARE DESCRIPTION LANGUAGE CONFIGURATIONS FOR A PHASE LOCKED LOOP FROM A SINGLE GENERIC MODEL FOR INTEGRATED CIRCUIT DESIGN

(75) Inventor: Kenton T. Dalton, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 69 days.

(21) Appl. No.: 10/859,857

(22) Filed: Jun. 2, 2004

(65) Prior Publication Data

US 2005/0273751 A1   Dec. 8, 2005

(51) Int. Cl.
   *G06F 17/50* (2006.01)
(52) U.S. Cl. .............................. 716/18; 716/16; 716/17
(58) Field of Classification Search ............... 716/1–18; 331/11, 25; 327/157, 156
   See application file for complete search history.

(56) References Cited

U.S. PATENT DOCUMENTS

| | | | |
|---|---|---|---|
| 5,946,478 A * | 8/1999 | Lawman ....................... | 716/17 |
| 6,542,040 B1 * | 4/2003 | Lesea ........................... | 331/11 |
| 6,704,908 B1 * | 3/2004 | Horan et al. .................. | 716/1 |
| 6,747,497 B1 * | 6/2004 | Ingino, Jr. ................... | 327/157 |
| 2004/0128641 A1 * | 7/2004 | Broberg et al. ............... | 716/18 |

* cited by examiner

*Primary Examiner*—Matthew Smith
*Assistant Examiner*—Binh Tat
(74) *Attorney, Agent, or Firm*—Fitch, Even, Tabin & Flannery

(57) ABSTRACT

A method and computer program are disclosed for generating a hardware description language configuration from a generic phase locked loop architecture that include steps of: (a) receiving as input values for a set of configuration variables for a phase locked loop; (b) applying the values for the set of configuration variables to a generic top level model of the phase locked loop to generate a specific configuration of the phase locked loop from the generic top level model; and (c) generating as output a hardware description language code for the specific configuration of the phase locked loop.

20 Claims, 8 Drawing Sheets

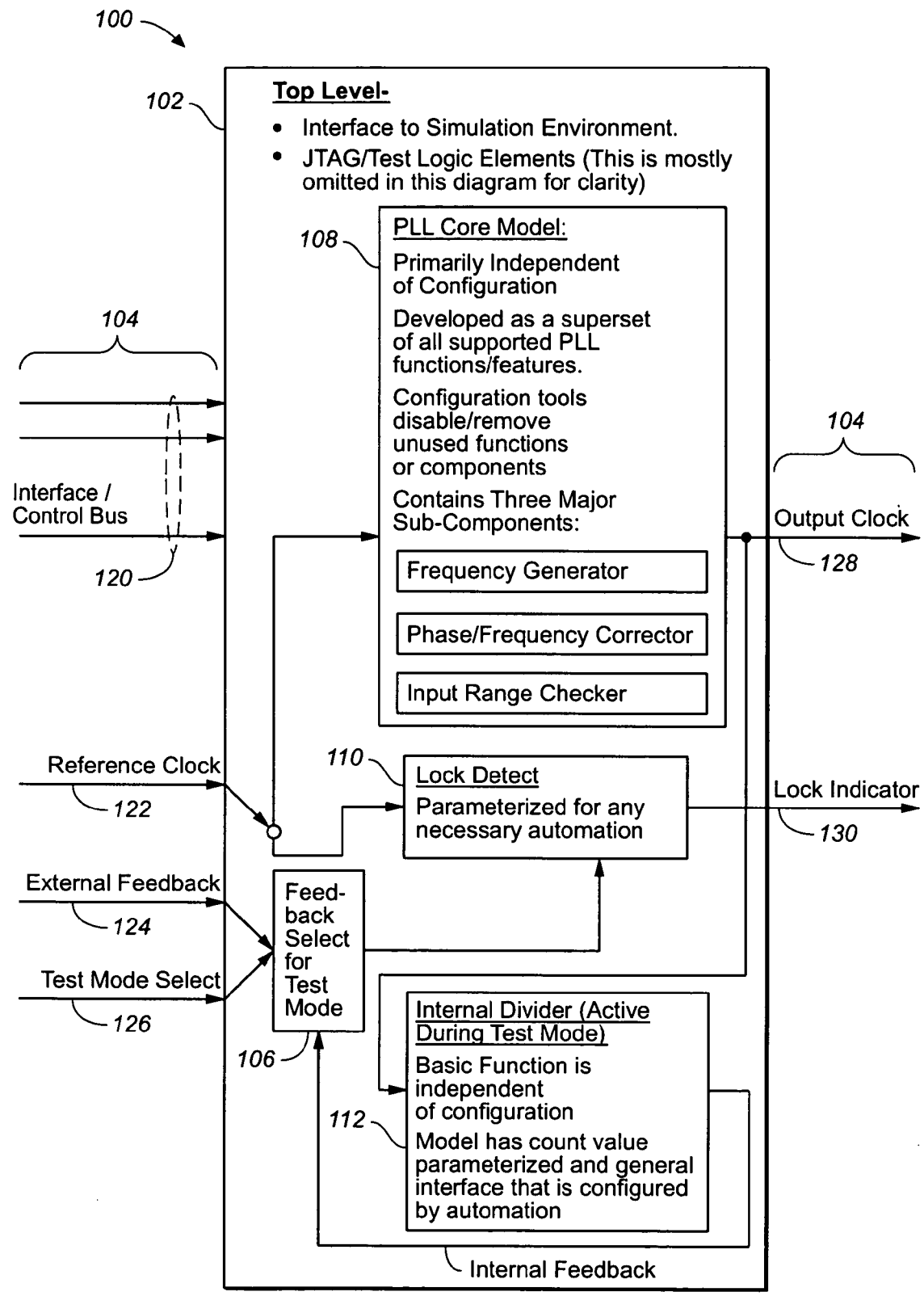
FIG._1

200 ⎯↘

```
module PLLF1PIPW100500(CKOUT, CKOUTN,
        LOCK, LSIPLLLOCK, REF, FB,
        EN, BYPASS, ENARST,
        RSEL200500,
        Z2, Z1, Z0, P1, P0,
        HDIV,
        LRESETN,
        HREF,
        JITLMT1, JITLMT0, CNTLMT1, CNTLMT0,
        LSIIDDTN, LSIPLLMODE, LSISCANMODE, LSIPLLFBDMODE,
        LSIPLLREFCLK, LSIPLLLRESETN, LSIPLLT1, LSIPLLT0,
        PLLVDD,
        PLLVSS);
output  CKOUT,
        CKOUTN,
        LOCK, LSIPLLLOCK;
input   REF, FB, EN, BYPASS, ENARST,
        RSEL200500,
        Z2, Z1, Z0, P1, P0,
        HDIV,
        LRESETN,
        HREF,
        JITLMT1, JITLMT0, CNTLMT1, CNTLMT0,
        LSIIDDTN, LSIPLLMODE, LSISCANMODE, LSIPLLFBDMODE,
        LSIPLLREFCLK, LSIPLLLRESETN, LSIPLLT1, LSIPLLT0,
        PLLVDD,
        PLLVSS;
```

FIG._2

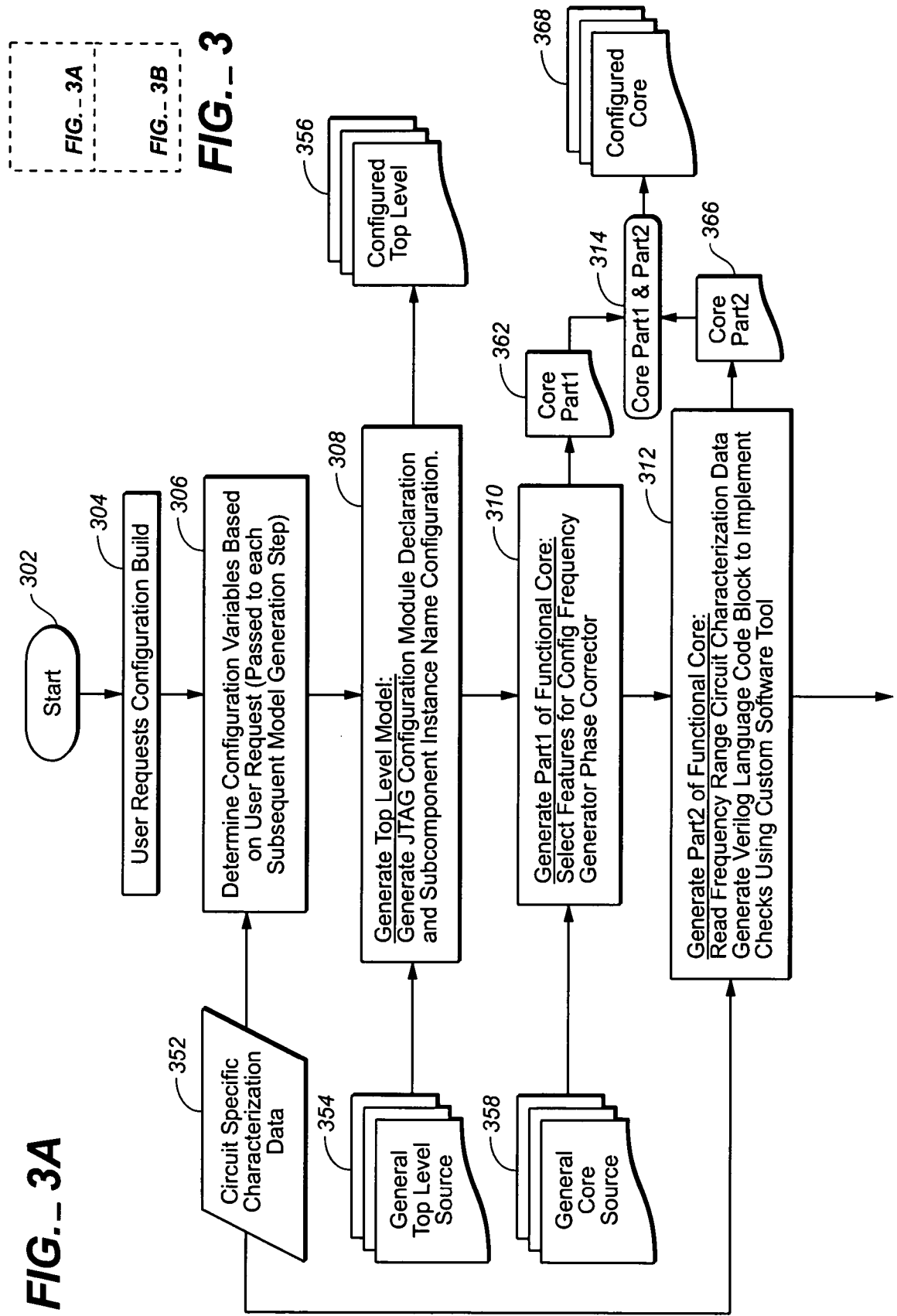

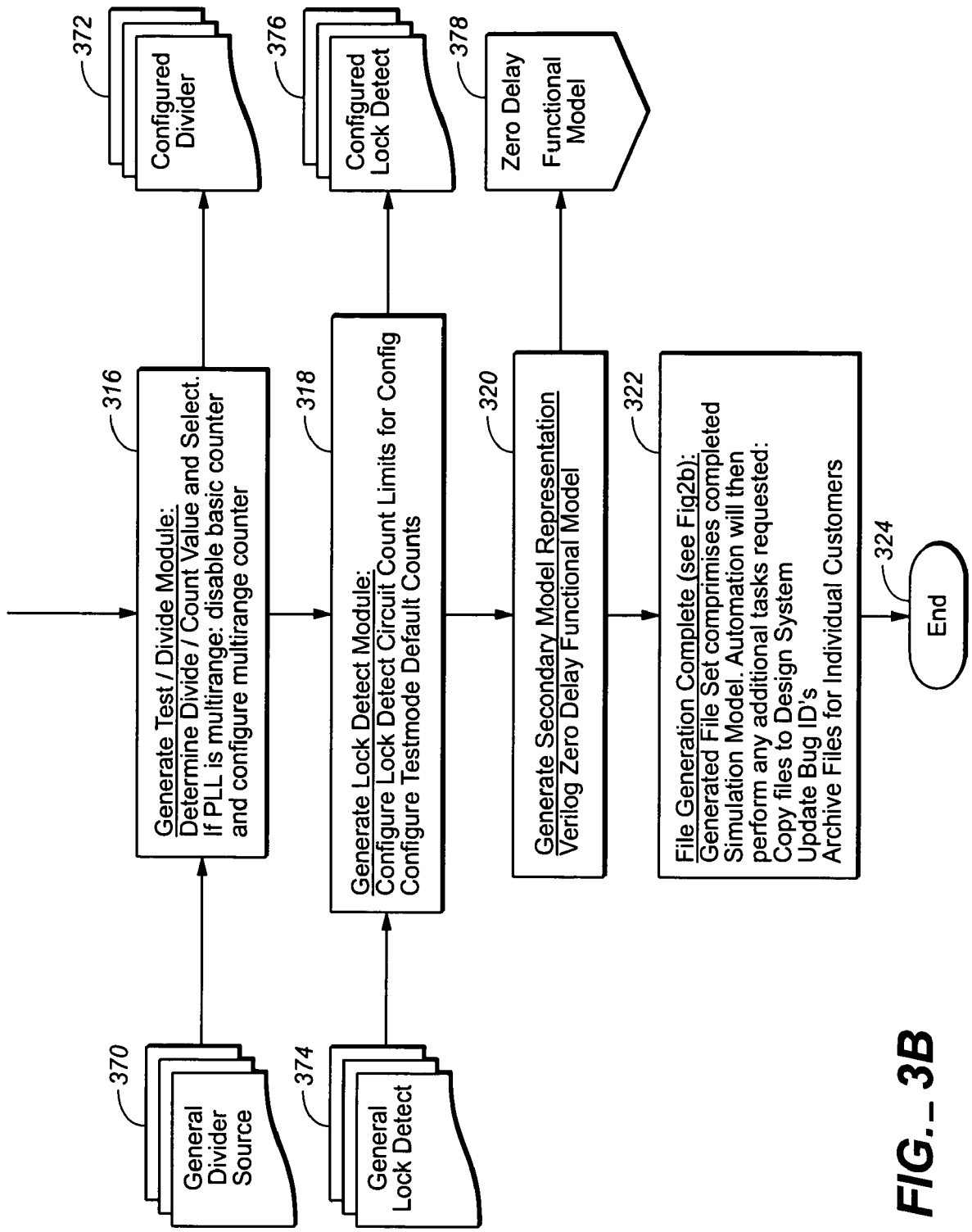
FIG._3B

400 ⤵

```
// Begin FAST Logic
// Generic bypass
or (LSEL, LSIPLLFBDMODE, LSISCANMODE);
or(SPLLMODE, LSIPLLMODE, LSISCANMODE);
LSI_MUX21 (SBP, BYPASS, 1'b0, SPLLMODE);
or (CKBP, SBP, LSISCANMODE);

// Generation of Internal EN/IDDTN signal for PLL Core and LD block
not (NLSISCANMODE, LSISCANMODE);
LSI_MUX21 (ENSM, EN, NLSISCANMODE, SPLLMODE);
and (ENIDDTN, ENSM, LSIIDDTN);

// Generation of Internal Reference Clock for PLL Core and LD block
LSI_MUX21 (SCANREF, REF, LSIPLLREFCLK, SPLLMODE);

// Lock Detect Inputs - T Bus
LSI_MUX21 (PT1, 1'b0, LSIPLLT1, SPLLMODE);
LSI_MUX21 (PT0, 1'b0, LSIPLLT0, SPLLMODE);
//Lock Detect Inputs - LDControl Bus
LSI_MUX21 (BPHREF, HREF, 1'b0, SPLLMODE);

// Lock Detect Inputs - LRESETN
LSI_MUX21 (MRESET, LRESETN, LSIPLLLRESETN, SPLLMODE);
and (LDRESETN, MRESET, ENIDDTN);

// Test Mode Setup - SPLLMODE Overrides values on bus
LSI_MUX21 (BPP1, P1, 1'b0, SPLLMODE);
LSI_MUX21 (BPP0, P0, 1'b0, SPLLMODE);
LSI_MUX21 (BPHDIV, HDIV, 1'b0, SPLLMODE);
LSI_MUX21 (BPZ2, Z2, 1'b1, SPLLMODE);
LSI_MUX21 (BPZ1, Z1, 1'b1, SPLLMODE);
LSI_MUX21 (BPZ0, Z0, 1'b1, SPLLMODE);
LSI_MUX21 (BPJITLMT0, JITLMT0, 1'b1, SPLLMODE);
LSI_MUX21 (BPJITLMT1, JITLMT1, 1'b1, SPLLMODE);
LSI_MUX21 (BPCNTLMT0, CNTLMT0, 1'b0, SPLLMODE);
LSI_MUX21 (BPCNTLMT1, CNTLMT1, 1'b0, SPLLMODE);
LSI_MUX21 (BPENARST, ENARST, 1'b1, SPLLMODE);
LSI_MUX21 (BPHDIV, HDIV, 1'b0, SPLLMODE);
// Only Rapid MultiRange has functional Z3 Pin
buf(BPZ3, 1'b0);
// Only Rapid MultiRange has functional R2/R1
buf(BPR2, 1'b0);
buf(BPR1, 1'b0);
LSI_MUX21 (BPR0, RSEL200500, 1'b1, SPLLMODE);
buf (LSIPLLSEL0, 1'b0);
buf (LSIPLLSEL1, 1'b0);

// PLLCORE Inputs - FEEDBACK
LSI_MUX21 (FEEDBACK, FB, DIVIDEOUT, SPLLMODE);
```

*FIG._4*

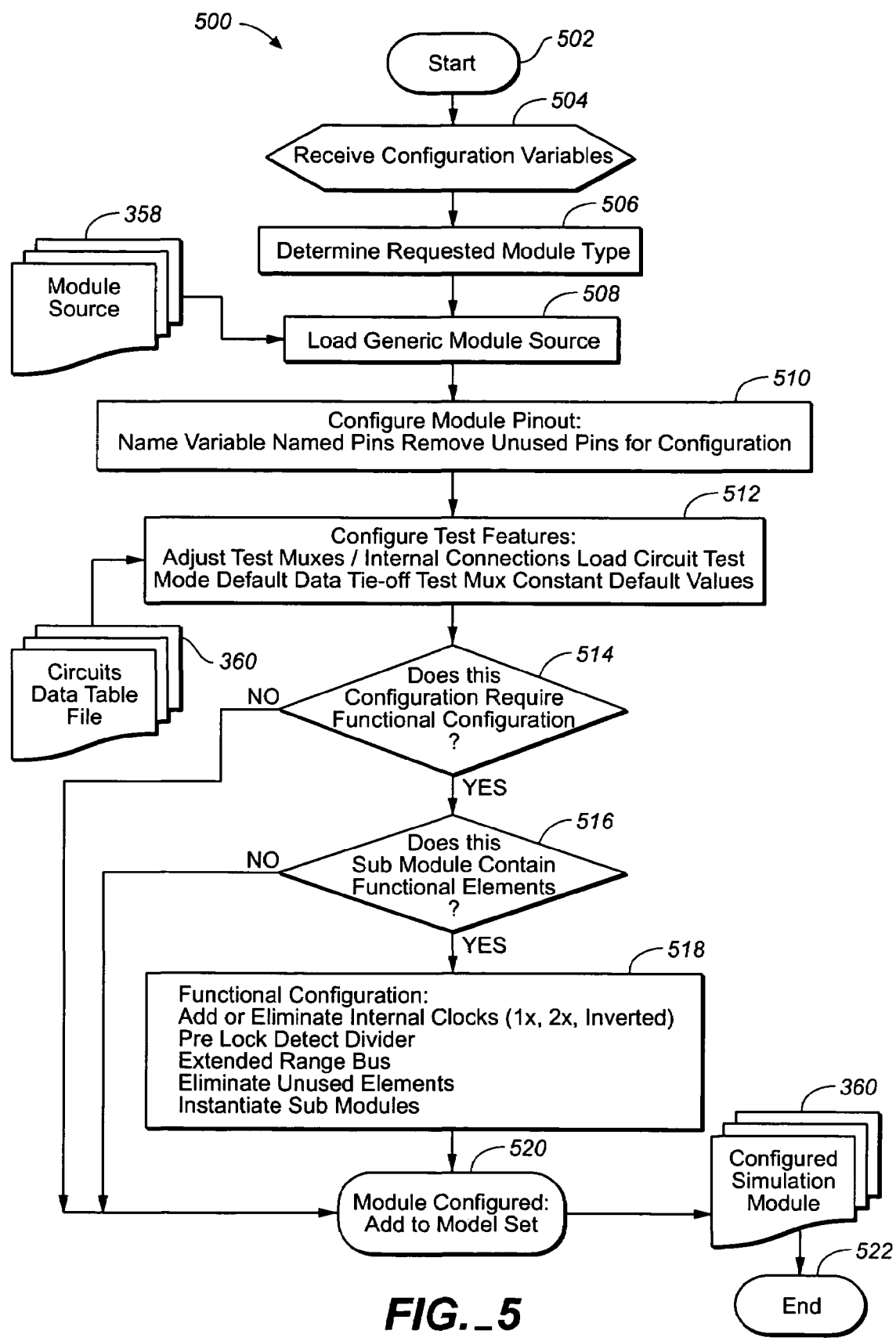
FIG._5

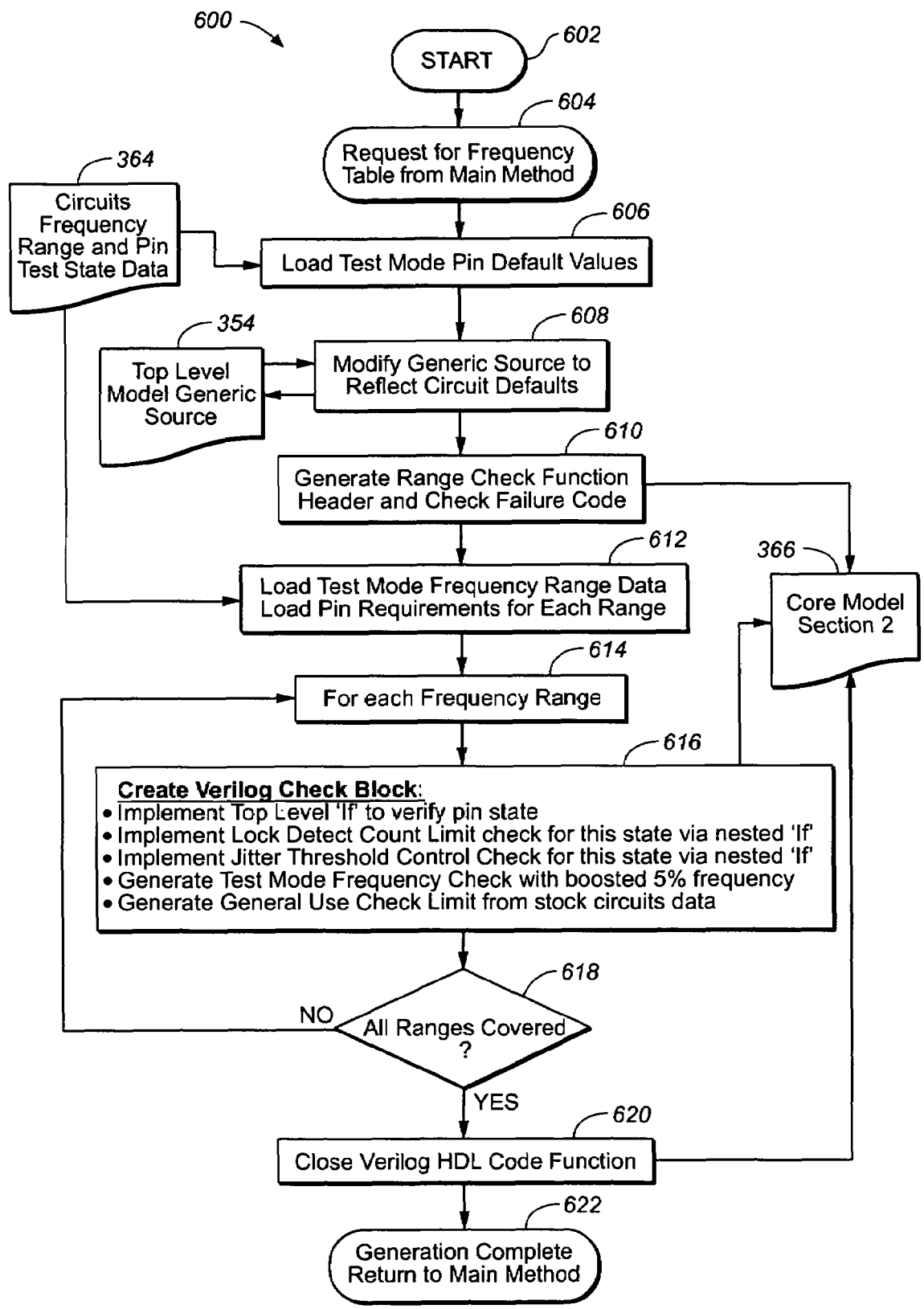
FIG._6

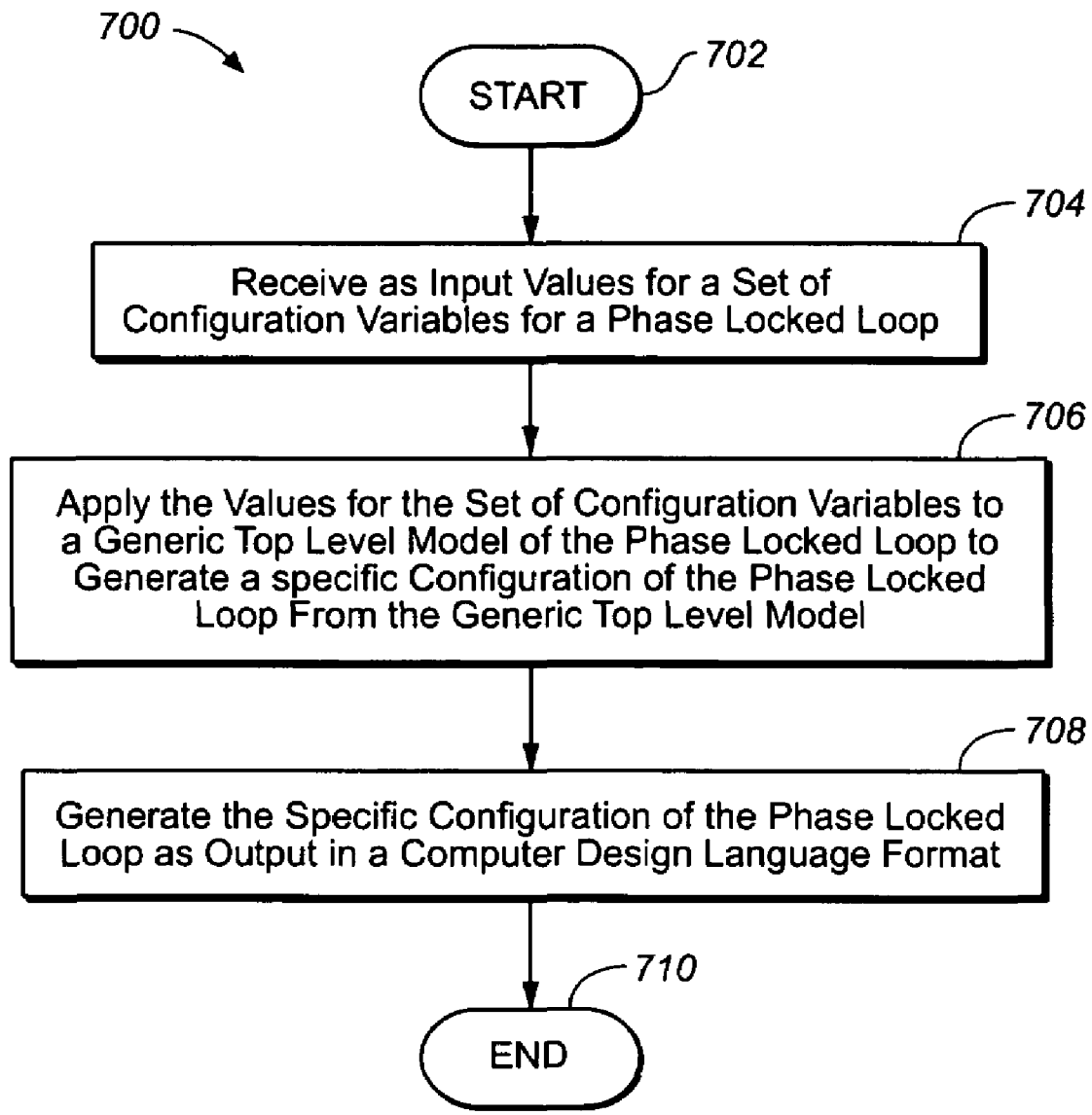
FIG._7

US 7,065,734 B2

METHOD OF GENERATING MULTIPLE HARDWARE DESCRIPTION LANGUAGE CONFIGURATIONS FOR A PHASE LOCKED LOOP FROM A SINGLE GENERIC MODEL FOR INTEGRATED CIRCUIT DESIGN

REFERENCE TO COMPUTER PROGRAM LISTING APPENDIX

The following computer program listing files are submitted on a compact disc and are incorporated herein by reference:

| NAME | CREATION DATE | SIZE (bytes) |
|---|---|---|
| AppendixI.txt | May 28, 2004 | 15,780 |
| AppendixII.txt | May 28, 2004 | 2,771 |
| AppendixIII.txt | May 28, 2004 | 10,557 |
| AppendixIV.txt | May 28, 2004 | 1,695 |
| AppendixV.txt | May 28, 2004 | 712 |
| AppendixVI.txt | May 28, 2004 | 200 |
| AppendixVII.txt | May 28, 2004 | 334 |
| AppendixVIII.txt | May 28, 2004 | 23,640 |
| AppendixIX.txt | May 28, 2004 | 1,499 |
| AppendixX.txt | May 28, 2004 | 5,548 |
| AppendixXI.txt | May 28, 2004 | 7,156 |

BACKGROUND OF THE INVENTION

1. Field of the Invention

The present invention is directed to integrated circuit design software used in the manufacture of integrated circuits. More specifically, but without limitation thereto, the present invention is directed to generating hardware description language (HDL) code for a phase locked loop in an integrated circuit design.

2. Description of the Prior Art

Phase locked loop circuits are extremely important analog components in an application-specific integrated circuit (ASIC) cell library. Previous methods for representing such components in a digital integrated circuit environment generally require a set of complex hardware description language (HDL) models for each integrated circuit technology.

SUMMARY OF THE INVENTION

In one embodiment of the present invention, a method of generating a hardware description language code from a generic phase locked loop architecture for an integrated circuit design includes steps of:

(a) receiving as input values for a set of configuration variables for a phase locked loop;

(b) applying the values for the set of configuration variables to a generic top level model of the phase locked loop to generate a specific configuration of the phase locked loop from the generic top level model; and (c) generating as output a hardware description language code for the specific configuration of the phase locked loop.

In another aspect of the present invention, a computer program product for generating a hardware description language code from a generic phase locked loop architecture for an integrated circuit design includes a medium for embodying a computer program for input to a computer and a computer program embodied in the medium for causing the computer to perform steps of:

(a) receiving as input values for a set of configuration variables for a phase locked loop;

(b) applying the values for the set of configuration variables to a generic top level model of the phase locked loop to generate a specific configuration of the phase locked loop from the generic top level model; and (c) generating as output a hardware description language code for the specific configuration of the phase locked loop.

DESCRIPTION OF THE DRAWINGS

The present invention is illustrated by way of example and not limitation in the accompanying figures, in which like references indicate similar elements throughout the several views of the drawings, and in which:

FIG. 1 illustrates a generic phase locked loop (PLL) model according to an embodiment of the present invention;

FIG. 2 illustrates an implementation in Verilog HDL format for the generic top level source model of FIG. 1;

FIG. 3 illustrates a flow diagram of a method of generating an HDL configuration from the generic phase locked loop architecture of FIG. 1;

FIG. 4 illustrates an example of JTAG test signal generation in Verilog HDL format for the flow diagram of FIG. 3;

FIG. 5 illustrates a flow diagram of a method of generating the HDL models for the phase locked loop core module of FIG. 1;

FIG. 6 illustrates a flow diagram for a method of generating frequency range checking code for the phase locked loop HDL model according to an embodiment of the present invention; and FIG. 7 illustrates a flow chart summarizing the method described for FIG. 3 according to an embodiment of the present invention.

For convenience, signal names are used interchangeably with their respective inputs and outputs, for example, a reference clock input is also referred to as a reference clock signal.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE APPENDICES

Appendix I illustrates an example of a top level code in Verilog HDL format for a specific phase locked loop generated from the flow diagram of FIG. 3;

Appendix II illustrates an example of a Verilog HDL module for the frequency generator in the phase locked loop model of FIG. 1;

Appendix III illustrates an example of a Verilog HDL module for the phase/frequency correction module in the phase locked loop model of FIG. 1;

Appendix IV illustrates an example of a Verilog HDL module for the input range check module in the phase locked loop model of FIG. 1;

Appendix V illustrates an example of a corresponding table of variable limits for FIG. 11;

Appendix VI illustrates an example of test mode defaults for the table of variable limits in FIG. 12;

Appendix VII illustrates an example of a makefile for the flow diagram of FIG. 3;

Appendix VIII illustrates an example of a Verilog HDL module for the lock detect module in the phase locked loop model of FIG. 1;

Appendix IX illustrates an example of a Verilog HDL module for the internal divider module in the phase locked loop model of FIG. 1;

Appendix X illustrates an example of a Verilog HDL module of the generic lock detect source block for the flow diagram of FIG. 3; and Appendix XI illustrates an example of a Verilog HDL module for a zero delay functional module for the flow diagram of FIG. 3.

DESCRIPTION OF THE ILLUSTRATED EMBODIMENTS

A disadvantage of previous methods for generating hardware description language (HDL) code for phase locked loops in integrated circuits is the requirement for significant development overhead and a substantial support effort for assisting system design users with questions and applications. Also, a complete system design typically requires a large number of extremely complex HDL models. The development, management and support of these HDL models represents a costly effort for an application-specific integrated circuit (ASIC) vendor, and the support issues create hidden risks to the user. For example, a large number of source files presents a significant risk that modifications to shared components may not be consistent with different circuit configurations, resulting in an excessive amount of redundant effort for tracking and supporting modifications to multiple circuit configurations.

A previous solution to the problem of managing, developing, and support of large HDL models such as those implementing phase locked loops is to limit the number of HDL configurations to a minimum set necessary for a complete system design. However, this solution avoids rather than solves the problem, and unnecessarily burdens the user with a software design issue instead of focusing on technological and circuit design issues. Other disadvantages include the oversimplification of circuit representation in circuit simulation for maintenance of the HDL models and forcing users to seek custom circuit configurations not included in the ASIC cell library and the associated custom model development.

An important feature of the present invention is that an entire library of phase locked loop circuit models may be advantageously reduced to a single set of small HDL files. As a result, highly configuration dependent code may be generated consistently and accurately, manual effort is removed from releasing phase locked loop configuration models, the process of updating files to track circuit modifications is automated, and the creation of custom cells for highly specialized applications is automated, and a more accurate model representative of the analog circuit's behavior in a digital environment may be developed.

The method of the present invention is described for generating HDL code for phase locked loop circuits, however, the term HDL code as used herein includes all computer design language formats that may be used to practice various embodiments of the present invention within the scope of the appended claims.

In one embodiment of the present invention, a method of generating a hardware description language code from a generic phase locked loop architecture for an integrated circuit design includes steps of:

(a) receiving as input values for a set of configuration variables for a phase locked loop;

(b) applying the values for the set of configuration variables to a generic top level model of the phase locked loop to generate a specific configuration of the phase locked loop from the generic top level model; and (c) generating as output the specific configuration of the phase locked loop in a computer design language format.

FIG. 1 illustrates a generic phase locked loop (PLL) model 100 according to an embodiment of the present invention. Shown in FIG. 1 are a top level block 102, a circuit simulation environment interface 104, a test logic element 106, a phase locked loop core module 108, a lock detect module 110, and an internal divider module 112.

The top level block 102 includes the circuit simulation environment interface 104, the test logic element 106, the phase locked loop core module 108, the lock detect module 110, and the internal divider module 112.

The circuit simulation environment interface 104 includes the set of input and output pins that connect the top level block 102 to the circuit simulation environment. In the example of FIG. 1, the input and output pins are an interface control bus input 120, a reference clock input 122, an external feedback input 124, a test mode select input 126, a PLL clock output 128, and a lock indicator output 130.

The interface control bus input 120 represents the I/O pins of the specific phase locked loop circuit being modeled in a circuit design. It is important that the I/O pins and the order in which they are arranged are correctly defined for the design system software and that the I/O pins are correctly configured for the functionality required of the phase locked loop model. This is achieved in the method of the present invention by representing the interface control bus input 120 as a superset in the source code for the top level block 102. Components and pins that are not needed in the phase locked loop model are preferably removed automatically according to the requested phase locked loop configuration using well-known scripting tools and automation techniques.

The reference clock input 122 is used to connect the phase lock loop module 108 and the lock detect module 110 to an external reference clock signal that is used to generate the PLL clock signal 128.

The external feedback input 124 is used to connect the test logic element 106 to an external test signal. In this example, only one test logic element 106 is illustrated, however, other PLL models having no test logic elements or multiple test logic elements connected to the circuit simulation environment interface may be used to practice various embodiments of the present invention within the scope of the appended claims.

The test mode select input 126 is used to connect the lock detect module 110 to either the external feedback signal 124 or the internal feedback signal generated by the internal divider module 112.

The PLL clock output 128 connects the output of the phase locked loop module 108 to the circuit simulation interface.

The lock indicator output 130 is set to a logic "1" by the lock detect module 110 when the reference clock signal 122 and the feedback signal from the test logic element 106 have the same frequency and phase.

The phase locked loop module 108 includes a frequency generator 140, a phase/frequency correction module 142, and an input range check module 144.

Appendix II illustrates an example of a Verilog HDL module for the frequency generator in the phase locked loop model of FIG. 1. The frequency generator 140 generates clock pulses at a selectable frequency and includes a mechanism to shift the clock phase.

Appendix III illustrates an example of a Verilog HDL module for the phase/frequency correction module 142 in the phase locked loop model of FIG. 1. The primary function of a phase locked loop circuit is to detect the incoming reference clock signal and to generate an output signal having a selectable frequency and phase relationship with the reference clock signal that is fed back to the input of the phase locked loop. The phase/frequency correction module 142 compares the reference clock signal frequency with the output signal from the internal divider module 112.

Once the output of the internal divider module 112 has been verified as stable and within a specified frequency range, the phase/frequency correction module 142 adjusts the frequency generator 140 output period and associated frequency via the SetFreqGen task in FIG. 9. The frequency generator 140 output period and associated frequency are adjusted to match the reference clock signal frequency and the output of the internal divider module 112.

After the frequency generator 140 output period and associated frequency have been adjusted, the output clock phase is adjusted using the CKDelta variable in the frequency generator module of FIG. 9 based on measurements of the frequency synchronized signals. When the reference clock signal frequency and the output signal from the internal divider module 112 are locked, the global state variable LOCKSTATE is set to indicate that the phase locked loop is fully locked and operating normally.

Appendix IV illustrates an example of a Verilog HDL module for the input range check module 144 in the phase locked loop model of FIG. 1. The purpose of the input range check module 144 is to verify that the inputs are correct and within normal operating limits so that is safe to continue. The input range check module 144 is invoked when the CheckFrequencyRange task is called by the Verilog HDL module of FIG. 10. The Verilog HDL module for the input range check module 144 may be generated completely by a simple PERL script. The input to the PERL script may be, for example, a table of variable limits set by the circuit designer. The PERL script parses the table of variable limits and writes out the Verilog function that returns a '1' for success and '0' for failure.

Appendix V illustrates an example of a corresponding table of variable limits for the Verilog HDL module of Appendix IV.

Appendix VI illustrates an example of test mode defaults for the table of variable limits in Appendix V. The test mode sets a number of input variables to default values acquired from the data file of FIG. 12B.

Appendix VIII illustrates an example of a Verilog HDL module for the lock detect module 110 in the phase locked loop model of FIG. 1. The lock detect module 110 is parameterized for design system libraries that include both high speed and functional only versions of circuit models that have no Verilog specify block. The functional only versions of circuit models may be simulated faster and require less memory during runtime than full circuit models that include timing information.

Appendix IX illustrates an example of a Verilog HDL module for the internal divider module 112 in the phase locked loop model of FIG. 1. The internal divider module 112 has a basic function that is independent of any specific configuration, namely, that of dividing the PLL clock signal 128 by a selectable divisor. The internal divider module 112 may be active in the operational mode as well as during the test mode and has a parameterized count value and a general interface that is configured by automation using the variable COUNTVAL to whatever is required by the phase locked loop model as illustrated in FIG. 16.

The general phase locked loop model 100 may be used to generate a set of PLL models that have the same basic high-level design, however, each PLL model may have a function and structure that is dependent on a specific hardware circuit configuration.

FIG. 2 illustrates an implementation in Verilog HDL format 200 for the generic top level source model of FIG. 1.

FIG. 3 illustrates a flow diagram 300 of a method of generating an HDL configuration from the generic phase locked loop architecture 100 of FIG. 1.

Step 302 is the entry point of the flow diagram 300.

In step 304, configuration parameters for the phase locked loop build is received as input from a user. The configuration parameters provided by the user may include, for example, the minimum input frequency, the top level pinout, the outputs to be generated, the test mode configuration, and defaults.

Examples of the outputs to be generated are the internal clock signal, the frequency doubled internal clock signal, and the inverted internal clock signal.

In step 306, the values for a set of configuration variables are determined from the user request information coded into the makefile 1400 by the system designer according to well-known techniques and the circuit specific characterization data block 352. The circuit specific characterization data block 352 includes the supported output frequency ranges as illustrated in FIG. 12B. The values determined for the set of configuration variables is propagated to each subsequent model generation step.

Appendix VII illustrates an example of a makefile for the flow diagram of FIG. 3.

In step 308, a configured top level model 356 of the phase locked loop design is generated from the set of configuration variables and the generic top level source block 354. The top level model 356 includes the test logic configuration for commercially available test software available from, for example, JTAG, to generate a high performance version of the phase locked loop model having no intrinsic timing and a corresponding version of the Verilog code automatically.

FIG. 4 illustrates an example of JTAG test signal generation in Verilog HDL format 400 for the flow diagram of FIG. 3.

In step 310, a specific configuration of the generic phase locked loop model 100 of FIG. 1 is selected to generate hardware description language (HDL) modules for the phase locked loop core module 108 from the general core module source block 356, for example, as follows.

FIG. 5 illustrates a flow diagram 500 of a method of generating the HDL models for the phase locked loop core module 108 of FIG. 1.

Step 502 is the entry point of the flow diagram 500.

In step 504, the values of the configuration variables are received from step 306.

In step 506, the type of PLL core module requested by the configuration variables is determined from the user defined configuration, for example, in the makefile 1400 of FIG. 14. The user may also request that the model be built with or without timing information or as a placeholder function to be further defined later in the design cycle.

In step 508, the generic module source for the requested PLL core module type is loaded from the general core module source block 358 as illustrated in FIG. 15.

In step 510, the module pinout for the PLL core module 108 is configured. For example, the pins associated with the configuration variables are named and unused pins are removed from the configured module.

In step 512, the test logic is configured, for example, by including test multiplexers and internal connections. The test mode default data is loaded from the circuits data table file block 360, and the test multiplexer default values that are constants are connected to the corresponding voltage supply rails.

In step 514, if the PLL core module configuration requires a functional configuration, that is, more than a simple placeholder or "black box" function, then control is transferred to step 516, otherwise control is transferred to step 520.

In step 516, if a submodule of the PLL core module contains functional elements that require a functional configuration, then control is transferred to step 518, otherwise control is transferred to step 520.

In step 518, the functional configuration for the specific circuit model is generated, for example, by adding or removing the internal clock signal, the frequency doubled internal clock signal, and the inverted internal clock signal; by including a pre-lock detect divider or not; by including an extended range bus in certain configurations; by removing unused elements; and by instantiating submodules for the functional configuration, that is, renaming source modules to correspond to the specific module names required by the selected configuration.

In step 520, the PLL core module configuration is added to the HDL model set 360 and generated as output to the first part of the configured simulation module block 362.

Step 522 is the exit point for the flow diagram 500.

In step 312, frequency range checking code for the phase locked loop HDL model is generated, for example, as follows.

FIG. 6 illustrates a flow diagram 600 for a method of generating frequency range checking code for the phase locked loop HDL model according to an embodiment of the present invention.

Step 602 is the entry point of the flow diagram 600.

In step 604, the frequency range circuit characterization data for the phase locked loop HDL model are retrieved from the circuit specific characterization data block 352.

In step 606, the test mode pin default values are retrieved from the frequency range and pin test state data block 364.

In step 608, the generic top level source block 354 is modified to reflect the test mode pin default values, for example, from the table illustrated in FIG. 13.

In step 610, the range check function header and range check code for the phase locked loop HDL model is generated as output to the second part of the configured simulation module block 366.

In step 612, the test mode frequency range data and the pin requirements for each frequency range are loaded from the frequency range and pin test state data block 364.

In step 614, one of the frequency ranges for which test mode data was loaded in step 612 is selected.

In step 616, a check block is created, for example, in Verilog format and generated as output to the second part of the configured simulation module block 366. The check block implements a top level "If" to verify pin state, a lock detect count limit check for the pin state via nested "If", and a jitter threshold control check for the pin state via nested "If", for example, as illustrated in FIG. 12A. Also, test mode frequency check code may be generated for the frequency range increased by five percent to test the edge of allowed circuit behavior, and a general use check limit in effect when not performing the JTAG simulation may be generated from stock circuits data, for example, as illustrated in FIG. 12B.

In step 618, if all of the frequency ranges for which test mode data was loaded in step 610 have been selected, then control transfers to step 620. Otherwise, control is transferred to step 614.

In step 620, the check block termination code is generated as output to the second part of the configured phase locked loop HDL core module 366.

Step 622 is the exit point of the flow diagram 600.

In step 314, the first part of the configured phase locked loop HDL core module 362 and the second part of the configured phase locked loop HDL core module 366 are combined, and the combined configured phase locked loop HDL core module is generated as output to the configured simulation core model block 368.

In step 316, the configured internal divider block 372, for example, as illustrated in FIG. 16, is generated from the set of configuration variables and the generic divider source block 370. The generic divider source block 370 may be manually coded by the circuit designer as illustrated in FIG. 16.

In step 318, the configured lock detect block 376 is generated from the set of configuration variables and the generic lock detect source block 374.

Appendix X illustrates an example of a Verilog HDL module for the generic lock detect source block 374 in the flow diagram of FIG. 3. The generic lock detect source block 374 may be manually coded by the circuit designer as illustrated in FIG. 17.

In step 320, a Verilog zero delay functional model 378 may be generated as output for a design system that requires both a fully back annotated model via standard delay format (SDF) timing values as well as a functional model with lower simulation overhead that has only intrinsic timing values. The Verilog zero delay functional model may be derived from the HDL modules by removing the Verilog format "specify" timing block and the associated support code. The high overhead frequency checking code may also be removed from the full timing model.

Appendix XI illustrates an example of a Verilog HDL module for a zero delay functional module for the flow diagram of FIG. 3.

In step 322, the HDL file set generated for the simulation model is complete. If desired, the HDL files may be automatically copied to a design system, bug ID's may be updated according to well-known computer scripting methods, and the HDL files may be archived for individual users.

The qualification of false path timing constraints and the determination of the locations where synchronizers should be inserted may also be extended to automatically update the false path timing constraints based on user input, and synchronizers may be inserted into the integrated circuit design based on user input indicating whether or not a data path is valid.

Step 324 is the exit point of the flow diagram 300.

Appendix I illustrates an example of a top level code in Verilog HDL format for a specific phase locked loop generated from the flow diagram of FIG. 3.

In another embodiment of the present invention, a computer program product for generating a hardware description language code from a generic phase locked loop architecture for an integrated circuit design includes a medium for embodying a computer program for input to a computer and a computer program embodied in the medium for causing the computer to perform the following steps:

(a) receiving as input values for a set of configuration variables for a phase locked loop;

(b) applying the values for the set of configuration variables to a generic top level model of the phase locked loop to generate a specific configuration of the phase locked loop from the generic top level model; and (c) generating as output a hardware description language code for the specific configuration of the phase locked loop.

FIG. 7 illustrates a flow chart 800 summarizing the method described for FIG. 3 according to an embodiment of the present invention.

Step 702 is the entry point of the flow chart 700.

In step 704, values for a set of configuration variables for a phase locked loop are received as input.

In step 706, the values for the set of configuration variables are applied to a generic top level model of the phase locked loop to generate a specific configuration of the phase locked loop from the generic top level model.

in step 708, the specific configuration of the phase locked loop is generated as output in a computer design language format.

Step 710 is the exit point of the flow chart 700.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
   (a) receiving as input values for a set of configuration variables for a phase locked loop;
   (b) applying the values for the set of configuration variables to a generic top level model of the phase locked loop to generate a specific configuration of the phase locked loop from the generic top level model wherein the generic top level model includes a hardware description language module for a frequency generator, a hardware description language module for a phase/frequency correction module, a hardware description language module for a lock detect module, and a hardware description language module for a internal divider module; and
   (c) generating as output a hardware description language code for the specific configuration of the phase locked loop.

2. The method of claim 1 further comprising a step of generating the generic top level model.

3. The method of claim 2 wherein the generic top level model comprises a phase locked loop core module, a lock detect module, and an internal divider module.

4. The method of claim 3 wherein the phase locked loop core module comprises a frequency generator module, a phase/frequency correction module, and an input range check module.

5. The method of claim 4 wherein the generic top level model comprises test logic.

6. The method of claim 5 wherein step (b) further comprises configuring the test logic for the specific configuration of the phase locked loop.

7. The method of claim 1 wherein step (b) further comprises receiving as input a generic module source.

8. The method of claim 7 wherein step (b) further comprises configuring a module pinout for the specific configuration of the phase locked loop from the generic module source.

9. The method of claim 1 wherein step (b) further comprises generating a functional configuration for the specific configuration of the phase locked loop.

10. The method of claim 1 wherein step (b) further comprises generating computer code for testing analog control inputs and an input frequency range check for the specific configuration of the phase locked loop.

11. A computer program product for generating a hardware description language configuration from a generic phase locked loop architecture comprising a medium for embodying a computer program for input to a computer and a computer program embodied in the medium for causing the computer to perform steps of:
    (a) receiving as input values for a set of configuration variables for a phase locked loop;
    (b) applying the values for the set of configuration variables to a generic top level model of the phase locked loop to generate a specific configuration of the phase locked loop from the generic top level model wherein the generic top level model includes a hardware description language module for a frequency generator, a hardware description language module for a phase/frequency correction module, a hardware description language module for a lock detect module, and a hardware description language module for a internal divider module; and
    (c) generating as output a hardware description language code for the specific configuration of the phase locked loop.

12. The method of claim 11 further comprising a step of generating the generic top level model.

13. The computer program product of claim 12 wherein the generic top level model comprises a phase locked loop core module, a lock detect module, and an internal divider module.

14. The computer program product of claim 13 wherein the phase locked loop core module comprises a frequency generator module, a phase/frequency correction module, and an input range check module.

15. The computer program product of claim 14 wherein the generic top level model comprises test logic.

16. The computer program product of claim 15 wherein step (b) further comprises configuring the test logic for the specific configuration of the phase locked loop.

17. The computer program product of claim 11 wherein step (b) further comprises receiving as input a generic module source.

18. The computer program product of claim 17 wherein step (b) further comprises configuring a module pinout for the specific configuration of the phase locked loop from the generic module source.

19. The computer program product of claim 11 wherein step (b) further comprises generating a functional configuration for the specific configuration of the phase locked loop.

20. The computer program product of claim 11 wherein step (b) further comprises generating computer code for testing analog control inputs and an input frequency range check for the specific configuration of the phase locked loop.

* * * * *